United States Patent
Mo et al.

(10) Patent No.: US 7,071,072 B2
(45) Date of Patent: Jul. 4, 2006

(54) FORMING SHALLOW TRENCH ISOLATION WITHOUT THE USE OF CMP

(75) Inventors: Renee T. Mo, White Plains, NY (US); Shreesh Narasimha, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/710,001

(22) Filed: Jun. 11, 2004

(65) Prior Publication Data

US 2005/0277263 A1    Dec. 15, 2005

(51) Int. Cl.
*H01L 21/76* (2006.01)

(52) U.S. Cl. .................. 438/424; 438/700; 438/745

(58) Field of Classification Search ............... 438/352, 438/359, 400, 424, 438, 689, 951, 700, 745
See application file for complete search history.

(56) References Cited

U.S. PATENT DOCUMENTS

| | | | |
|---|---|---|---|
| 4,863,556 A | | 9/1989 | Reichert |
| 5,902,127 A | * | 5/1999 | Park .......................... 438/435 |
| 6,001,696 A | | 12/1999 | Kim et al. |
| 6,110,800 A | * | 8/2000 | Chou ......................... 438/431 |
| 6,159,822 A | * | 12/2000 | Yang et al. .................. 438/427 |
| 6,184,091 B1 | * | 2/2001 | Gruening et al. ........... 438/270 |
| 6,486,038 B1 | | 11/2002 | Maszara et al. |
| 6,498,072 B1 | * | 12/2002 | Azuma ....................... 438/427 |
| 6,531,377 B1 | * | 3/2003 | Knorr et al. ................ 438/435 |
| 6,653,201 B1 | * | 11/2003 | Chung ......................... 438/424 |
| 6,709,952 B1 | * | 3/2004 | Lai et al. ..................... 438/424 |
| 6,713,385 B1 | * | 3/2004 | Pipes et al. ................. 438/637 |
| 6,798,038 B1 | * | 9/2004 | Sato et al. ................... 257/510 |
| 2002/0137307 A1 | * | 9/2002 | Kim et al. ................... 438/432 |
| 2002/0155721 A1 | * | 10/2002 | Wang et al. ................ 438/700 |
| 2003/0013271 A1 | * | 1/2003 | Knorr et al. ................ 438/435 |
| 2003/0203595 A1 | * | 10/2003 | Divakaruni et al. ........ 438/435 |
| 2004/0126986 A1 | * | 7/2004 | Wise et al. ................. 438/424 |

OTHER PUBLICATIONS

Stanley Wolf, Silicon Processing For The VLSI Era, 1986, Lattice Press, vol. II, pp. 66-67.*

* cited by examiner

*Primary Examiner*—Michael Lebentritt
*Assistant Examiner*—Stanetta Isaac
(74) *Attorney, Agent, or Firm*—Ira D. Blecker

(57) ABSTRACT

Shallow trench isolation structures are formed without CMP by depositing a thick pad nitride and depositing oxide trench fill material such that: a) the material in the trenches is above the silicon surface by a process margin that allows for removal of trench fill in subsequent front end steps so that the final trench fill level is substantially coplanar with the silicon; and b) the oxide on the interior walls is easily removed, so that the pad nitride is removed in a wet etch.

22 Claims, 5 Drawing Sheets

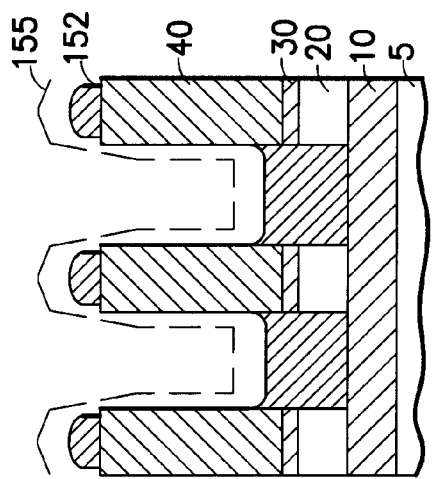
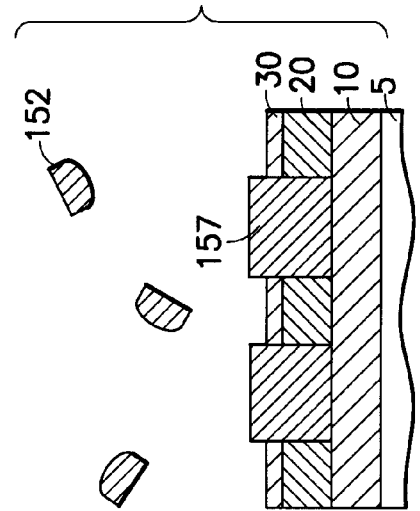
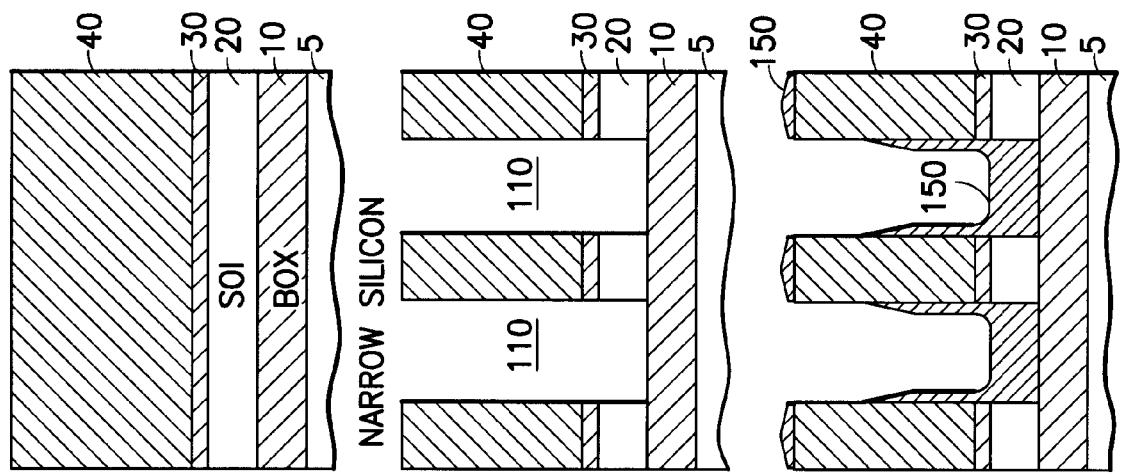

US 7,071,072 B2

FORMING SHALLOW TRENCH ISOLATION WITHOUT THE USE OF CMP

BACKGROUND OF INVENTION

1. Technical Field

The field of the invention is that of forming shallow trench isolation structures (STI) separating components of an integrated circuit with insulating films that are deposited in shallow trenches.

2. Background of the Invention

In recent years, the LOCOS method of forming isolation structures has given way to a shallow trench isolation method in which a trench is etched directionally into the semiconductor substrate.

The etching process permits much better control of the lateral extent of the structure than was possible with the LOCOS method, since the oxygen used in the oxidizing step diffused laterally and extended outward from the aperture in the hard mask defining the intended extent of the isolation structure.

The trench isolation process conventionally uses chemical-mechanical polishing (CMP) in which an abrasive removes excess trench fill material to establish a planar surface.

A drawback of this approach is that the CMP process produces scratches or chatter marks in the surface that may contribute to the total number of defects.

In current technology, one of the highest yield detractors in front end processing is CMP-induced defects.

Typical "fixed abrasive" CMP processes leave a high density of scratches. Slurry CMP produces "dishing" or local nonuniformity in wide isolation areas.

In addition, scratches may be filled with insulator or conductor, both of which can cause device failure or inconsistent performance.

The mechanical abrasive process tends to produce substantial variation in planarity over the wafer surface.

In addition, the equipment required and consumables for the process, such as slurry and abrasive pads, contribute to the cost of chips fabricated using this technique.

U.S. Pat. No. 6,001,696 shows a method of filling isolation apertures completely up to the top of a thick lift-off layer, with the result that there is a tall projection stub on the top of the isolation members, extending to a considerable distance above the device layer that may interfere with the lowest level of interconnect, such as a polysilicon local interconnect.

The semiconductor industry could benefit from a technique that produces acceptable planarity without the defects, extra equipment, consumable cost, and cycle time associated with the CMP process.

SUMMARY OF INVENTION

The invention relates to a method of filling and planarizing shallow trench isolation that does not employ CMP.

The inventive method comprises depositing a pad insulator layer of an appropriate thickness to set the isolation height, patterning the isolation trenches and depositing nonconformal trench fill material such that the amount of trench fill material deposited on the interior walls of the trench aperture is less than the amount of material within the trench. The trench fill material is recessed to expose the sidewalls of the pad insulator. The active areas without isolation trenches are treated to remove the pad layer.

One feature of the invention is that the pad insulator layer may be implanted to increase the etch rate relative to the etch rate of the trench fill material and facilitate removal.

Another feature of the invention is the formation of supplementary field apertures that break up large expanses of pad insulator.

BRIEF DESCRIPTION OF DRAWINGS

FIG. 1 illustrates a sequence in a first embodiment of the invention.

DETAILED DESCRIPTION

Figure 2A:
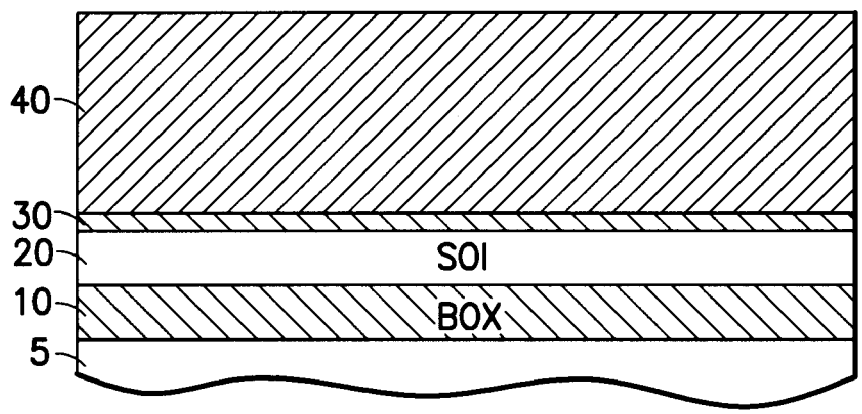
FIG. 2 illustrates a sequence in an embodiment employing supplementary field apertures.

FIG. 1 illustrates a sequence of steps in a method according to the invention. The starting material in FIG. 1A is a silicon substrate 5 having a buried oxide insulator (BOX) 10 formed in it with a silicon device layer 20 above and over the BOX (SOI). As used herein, "above" means higher than or further from the substrate. When applicable, terms such as over or directly above will be used in indicate that one element is vertically directly over another element in a cross sectional view. Pad oxide 30 has been formed on the wafer, and pad nitride 40, having a thickness selected as discussed below, completes the structure.

FIG. 1B shows the result of etching a number of apertures 110 through the pad nitride and pad oxide and then forming a trench through device layer 20 and stopping on the top surface of BOX 10. The trench may extend into the box, as a result of process variations. The width of the trench is set by functional considerations, well known to those skilled in the art. The trench will be filled with an insulator, and its function is to isolate adjacent devices from one another. The depth and width will be set to accomplish that function.

The invention may be applied to bulk semiconductor wafers, such as silicon or germanium as well as to SOI wafers or any semiconductor on insulator wafers. In the case of bulk wafers, the term device layer refers to the top level (which need not be a separate layer) of semiconductor material in which the devices are formed.

FIG. 1C shows the result of partially filling apertures 110 with an isolation insulator 150. At the stage illustrated, the insulating material has just risen to the level of the top of device layer 20. A relatively thin layer of isolation insulator material 150 (trench fill) has formed on the vertical walls of the apertures and on the top of the pillars of nitride 40 that are between neighboring trenches.

The deposition technique of isolation insulator 150 is preferably chosen to reduce the amount of material attached to the trench walls because that material is to be removed in subsequent steps. It is desirable that the thickness on the walls be less than a threshold amount in order to facilitate exposure of the pad nitride walls in the subsequent removal step. High density plasma (HDP) enhanced CVD of oxide (silicon dioxide) is a preferred method that deposits the material with a high degree of difference between horizontal and vertical surfaces.

FIG. 1D shows the result of etching the oxide 150 in a wet oxide etch such as dilute hydrofluoric acid or buffered hydrofluoric acid, to provide good control of the amount of material removed. The thin oxide on the interior walls of aperture 110 has been removed and the trench fill has been reduced to the height of layer 20 plus a process margin described below.

The dotted line labeled 155 represents the maximum amount of oxide that was put down. The area denoted with numeral 152 at the top of the pillars and the bottom of the apertures represents the amount of trench oxide remaining after the etch.

Next, FIG. 1E shows the result of etching the pad nitride 40, illustratively in hot phosphoric acid. Nitride 40 has been removed and isolated remaining portions of oxide 152 are shown as being removed. Numeral 157 denotes the new surface of the isolating oxide plugs in the isolation trenches. Those skilled in the art will appreciate that a margin has been left—i.e. that the surface of the isolation plug is above the level of the device layer 20. This is because further front end processing steps will remove some additional amount of oxide. The surface of oxide 155 in the trenches will be above the surface of layer 20 by a first margin (before etching oxide 155 from the walls) that is related to the thickness of the sidewall material. The first margin should be less than a reference amount such that the sidewall material can be removed. The height of the isolation plugs 157 of trench fill remaining after the wet etch will be above the height of layer 20 by a process margin set to allow for subsequent front end processes; i.e. such that the final height of the trench fill is substantially coplanar with the top of the device layer 20.

The preceding example has shown a simplified case in which all the portions of nitride 40 are of about the same size. The wet etch is able to attack the nitride portions from both sides, for efficient removal.

In most integrated circuits, there will be at least some areas of silicon that have devices with wide active areas that need to be isolated. The nitride over those areas is too wide to be removed in a reasonable process time with the nitride etch.

FIG. 2 illustrates a first alternative embodiment directed at a wide active area. FIG. 2A illustrates the same initial structure as in FIG. 1A. Substrate 5 is the bulk silicon, and BOX 10 supports SOI layer 20. Pad oxide 30 is present over the entire wafer, and pad nitride 40 completes the structure.

Figure 2B:
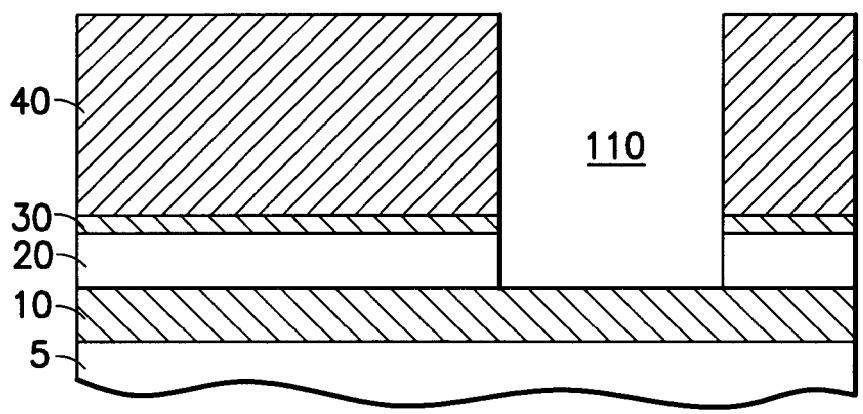

FIG. 2B shows the result of etching an aperture down through the pad nitride 40 and pad oxide 30 and through the device layer 20, stopping on BOX 10.

Figure 2C:
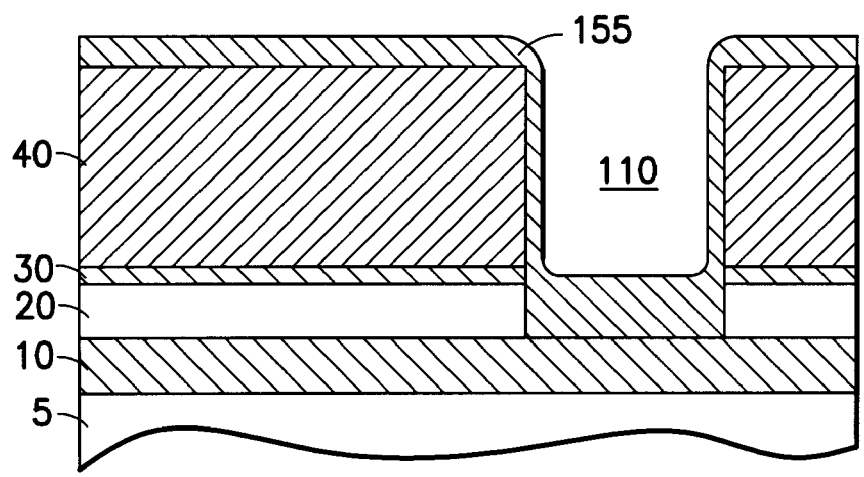

FIG. 2C shows the result of depositing a nonconformal oxide 155 in the trench and over the top of the pad nitride.

Figure 2D:
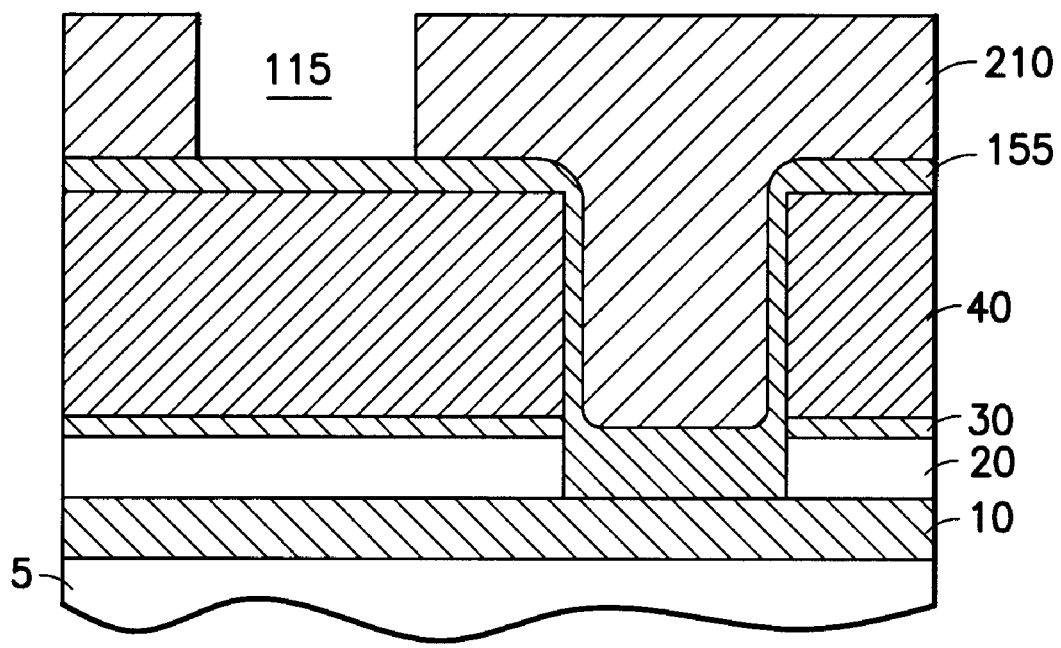

FIG. 2D shows the result of depositing photoresist 210 over the wafer and patterning it to open an aperture 115 offset from the isolation aperture. The oxide beneath the photoresist can be removed by any convenient process at an appropriate time The new aperture (and others like it outside the area shown, all referred to as "field apertures") are located overwide areas of pad nitride and close enough to apertures 110 to facilitate etching the nitride 40 from both sides.

Figure 2E:
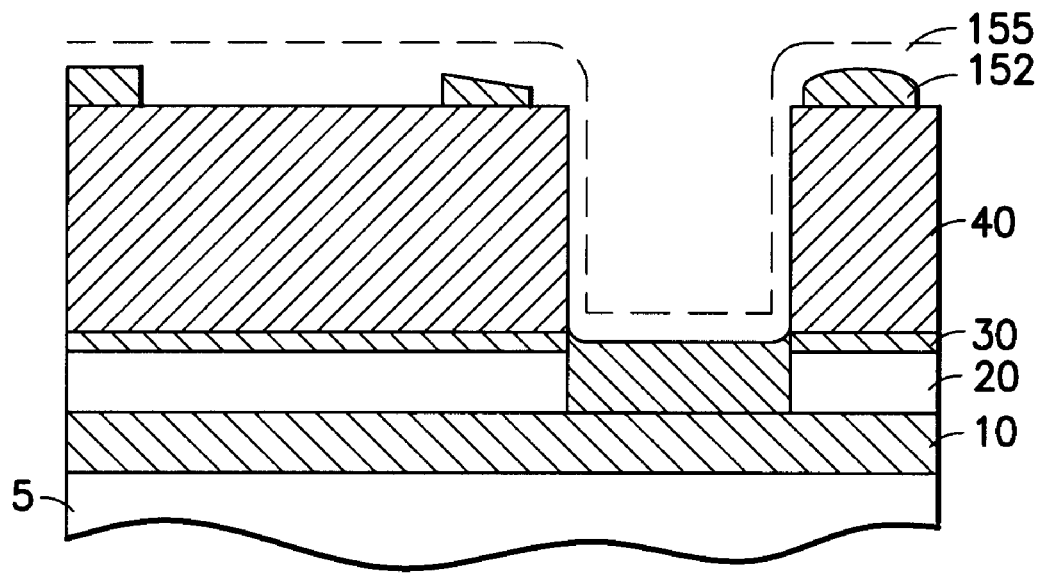

FIG. 2E shows the result of etching the isolation oxide 155, removing the oxide lining the walls of the isolation aperture and also exposing the pad nitride 40.

The exposed top surface of the pad nitride permits the phosphoric acid to penetrate into the body of the extensive slab of nitride in a way that is not possible without the extra apertures.

FIG. 3 shows an alternative method of practicing the invention, in which the pad nitride over wide areas is weakened by ion implantation.

Figure 3A:
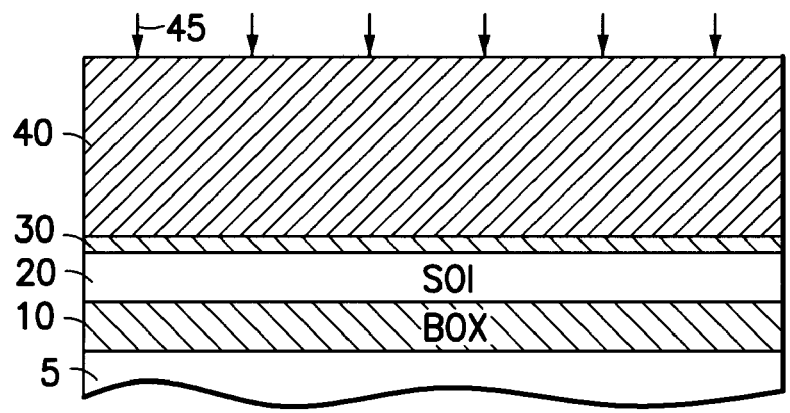
FIG. 3 illustrates a sequence in an embodiment employing ion implantation.

FIG. 3A shows the same initial structure as FIG. 2A, with substrate 5, having BOX 10 on it and device layer 20 above the box. Pad oxide 30 and pad nitride 40 complete the structure.

Figure 3B:
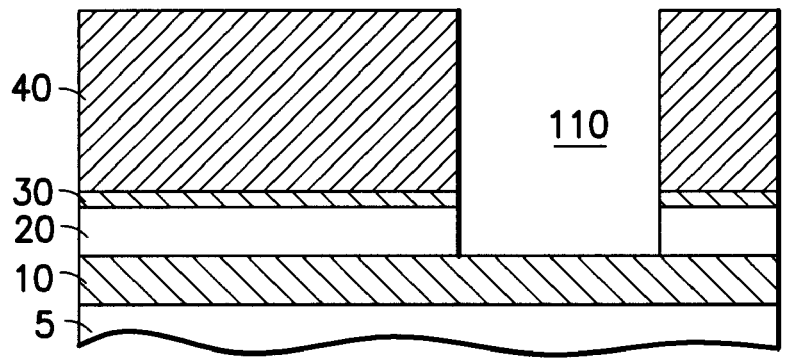

FIG. 3B shows the result of forming aperture 110 through pad nitride 40, pad oxide 30 and device layer 20.

Figure 3C:
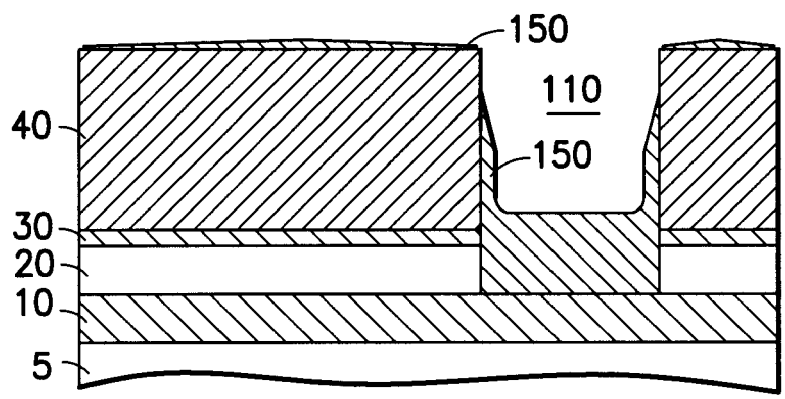

FIG. 3C shows the result of partially depositing the trench oxide 150.

Figure 3D:
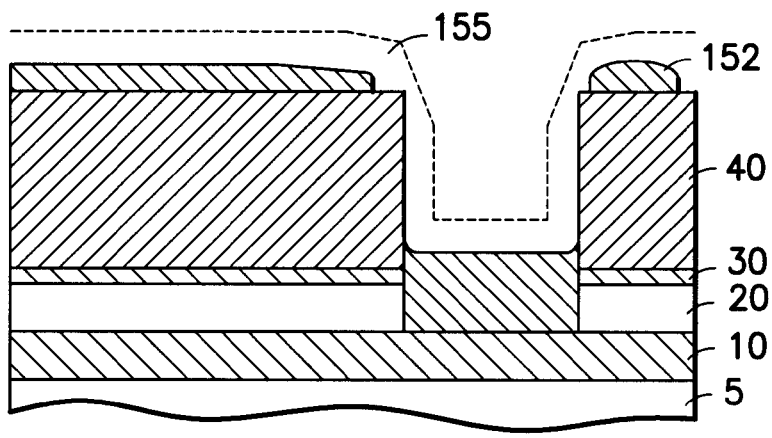

FIG. 3D shows the result of etching the trench oxide, leaving the desired plug in the trench (plus a margin to allow for further processing) and the residual amounts 152 on the top of pad nitride 40.

Figure 3E:
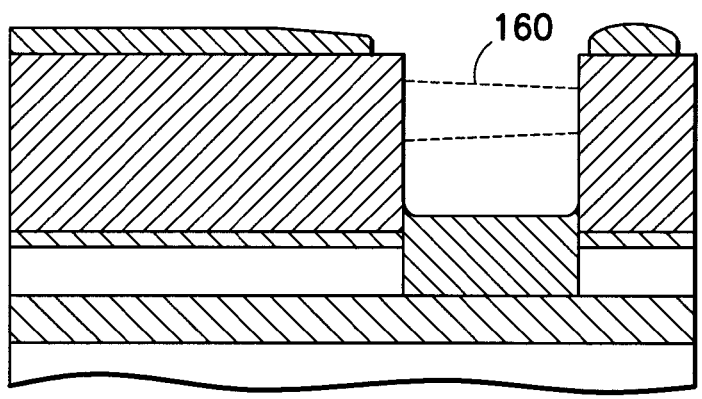

FIG. 3E shows the result of implanting ions such as Ge or As into pad nitride 40, prior to the nonconformal insulator fill. The implantation is denoted with the dashed line 160, indicating that the ions are implanted broadly and to a depth such that the ions in the tail of the implantation distribution have a concentration such that any penetration into the device layer does not have a significant effect on the transistors to be formed there.

Figure 3F:
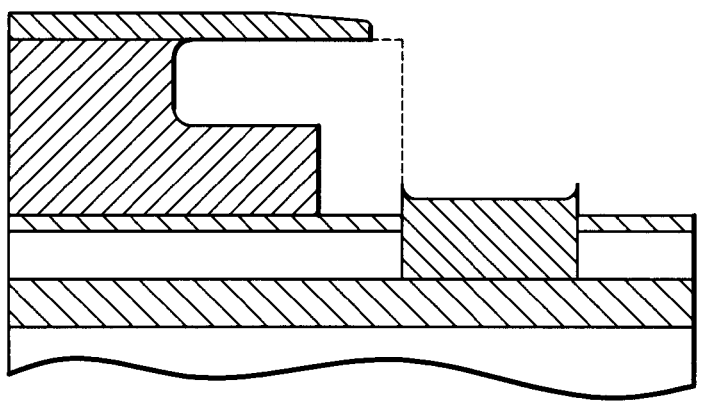

FIG. 3F shows the result of the phosphoric acid etch of the pad nitride 40. The narrow pillar of nitride on the right of the figure has been removed, since it is attacked from both sides as in FIG. 1.

On the left of aperture 110, the etchant has penetrated laterally into pad nitride 40 in aperture 42.

It is not necessary to have a blanket implant to facilitate pad nitride removal. The devices to be formed in the device layer may be sensitive to (and adversely affected by) the implant of the pad nitride. As a further option, an implant blocking mask may be used to cover and block the areas of the wafer where the trenches are close together so that only the wide areas receive the implant.

The implant energy may be set to penetrate to the bottom of the pad nitride, so that the nitride is removed rapidly throughout its entire depth.

As a further alternative to this embodiment, both auxiliary trenches in wide field areas and implants may be used.

In all embodiments of this invention, the trench isolation is formed by undercutting the pad nitride, therefore megasonic cleaning or another particle removal technique is recommended to remove any residual oxide particles that may cling to the wafer as it is removed from the nitride etch solution. Megasonics are not strictly required to form the structure described in the invention, however they will assist with minimizing the number of defects, as known to those skilled in the art.

The oxide particles (residual HDP) are formed when the pad nitride is undercut because of the low etch rate of silicon dioxide in hot phosphoric acid. They will be present in the phosphoric acid during the pad nitride etch and may adhere to the wafer surface as the wafers are pulled out of the phosphoric acid. An additional clean to remove these particles is recommended to minimize defects.

Those skilled in the art will appreciate that various materials may be used according to the invention.

A preferred material for nitride 40 is plasma enhanced chemical vapor deposited (PECVD) nitride. This method of deposition produces a film that is etched much faster (about twice as fast) than standard low pressure chemical vapor deposited (LPCVD) nitride. Those skilled in the art are well aware of suitable parameters for these various methods, which will vary with the brand of deposition tool and are routinely tuned to suit a particular process.

A preferred method for the trench fill oxide is high density plasma deposition, which produces a relatively thin thickness on vertical surfaces.

As an example, a wafer may have a device layer thickness of from about 20 to 150 nm and a pad nitride thickness in the range of about 50 to 150 nm. The trench oxide fill may be from 35 to 300 nm, so that the first margin (distance of trench fill surface over device layer surface) can be from 15 to 150 nm and the process margin to allow for subsequent front end processing can be from 10 to 145 nm. This example is simply meant to demonstrate the wide process window for this invention. The appropriate values for these film thicknesses and process margins should be chosen to match the design considerations and process flow of the product of interest.

Other integrated circuits and processes will have parameters differing from the foregoing in order to meet their requirements.

While the invention has been described in terms of several preferred embodiments, those skilled in the art will recognize that the invention can be practiced in various versions within the spirit and scope of the following claims.

What is claimed is:

1. A method of forming a set of insulator plugs in an isolation trench in a semiconductor substrate having a device layer, without the use of CMP, comprising the steps of:
   depositing a pad insulator layer having a pad thickness over said device layer surface;
   etching a set of isolation apertures through said pad insulator and said device layer to an isolation depth;
   depositing in a single deposition step an isolation insulator layer in said isolation apertures to a depth sufficient to fill said isolation apertures above said device layer by a first margin that is less than the thickness of said pad insulator and having a sidewall thickness on isolation aperture walls;
   etching said isolation insulator layer such that said sidewall thickness of said isolation insulator on said aperture walls is removed; whereby at least some of said isolation insulator remains disposed on a top surface of said pad insulator as a remaining portion of said isolation insulator layer; and remaining isolation plugs of said isolation insulator layer fill said isolation apertures with an isolation plug surface above said device layer surface by a second margin; and
   etching said pad insulator layer with an etchant that does not attack said isolation insulator layer, whereby said pad insulator and said remaining portion of said isolation insulator layer are removed in the same step and said isolation plugs fill said apertures without CMP.

2. A method according to claim 1, in which said semiconductor substrate is an SOI wafer in which said device layer is formed above a buried insulator layer.

3. A method according to claim 2, in which said pad thickness is such that said sidewall thickness is less than a sidewall threshold amount.

4. A method according to claim 2, in which said first margin is greater than said sidewall threshold amount.

5. A method according to claim 1, in which said semiconductor substrate is a bulk silicon wafer in which said device layer is formed in said silicon wafer.

6. A method according to claim 5, in which said pad thickness is such that said sidewall thickness is less than a sidewall threshold amount.

7. A method according to claim 5, in which said first margin is greater than said sidewall threshold amount.

8. A method according to claim 1, in which said pad thickness is such that said sidewall thickness is less than a sidewall threshold amount.

9. A method according to claim 1, in which said first margin is greater than said sidewall threshold amount.

10. A method of forming a set of insulator plugs in an isolation trench in a semiconductor substrate having a device layer, without the use of CMP, comprising the steps of:
    depositing a pad insulator layer having a pad thickness;
    implanting said pad insulator with ions such that implanted areas of said pad insulator have an etch rate substantially greater than unimplanted areas of said pad insulator;
    etching a set of isolation apertures through said device layer to an isolation depth;
    depositing in a single deposition step an insulator layer in said isolation apertures to a depth sufficient to fill said isolation apertures above said device layer by a first margin that is less than the thickness of said pad insulator and having a sidewall thickness on isolation aperture walls;
    etching said insulator layer such that said sidewall thickness of said insulator on said isolation aperture walls is removed; whereby at least some of said isolation insulator remains disposed on a top surface of said pad insulator as a remaining portion of said isolation insulator layer; and remaining insulator plugs of said insulator layer fill said isolation apertures above said device layer;
    and etching said pad insulator layer with an etchant that does not attack said insulator layer, whereby said pad insulator and said remaining portion of said isolation insulator layer are removed and said isolation plugs fill said isolation apertures without CMP.

11. A method according to claim 10, in which at least areas of pad nitride disposed between apertures separated by greater than a minimum active area distance are implanted.

12. A method according to claim 10, in which only areas of pad nitride disposed between apertures separated by greater than a minimum active area distance are implanted.

13. A method according to claim 12, in which said pad thickness is such that said sidewall thickness is less than a sidewall threshold amount.

14. A method according to claim 12, in which said first margin is greater than said sidewall threshold amount.

15. A method according to claim 10, in which said ions have an implantation energy such that less than a threshold amount of ions penetrate said device layer.

16. A method according to claim 10, in which said ions have an implantation energy such that at least a threshold concentration of ions extend throughout said pad insulator layer.

17. A method according to claim 10, in which said pad thickness is such that said sidewall thickness is less than a sidewall threshold amount.

18. A method according to claim 10, in which said first margin is greater than said sidewall threshold amount.

19. A method according to claim 10, in which said implanted areas are formed only in areas of pad nitride disposed between isolation apertures separated by greater than a minimum active area distance.

20. A method of forming a set of isolation plugs in an isolation trench in a semiconductor substrate having a device layer without the use of CMP comprising the steps of:
    depositing a pad insulator layer having a pad thickness;
    etching a set of isolation apertures through said device layer to an isolation depth;
    depositing an isolation insulator layer in said isolation apertures to a depth sufficient to fill said isolation apertures above said device layer by a first margin and having a sidewall thickness on isolation aperture walls;
etching said isolation insulator layer such that said sidewall thickness of said isolation insulator on said isolation aperture walls is removed and remaining isolation plugs of said isolation insulator layer fill said apertures substantially coplanar with said device layer, without CMP;

forming a set of field apertures in areas of pad insulator disposed between isolation apertures separated by a minimum active area distance; and etching said pad insulator layer with an etchant that does not attack said isolation insulator layer, whereby said pad insulator is removed and said isolation plugs fill said aperture without CMP.

21. A method according to claim 20, in which said step of etching said isolation insulator layer such that said sidewall thickness of said isolation insulator on said isolation aperture walls is removed and remaining isolation plugs of said insulator layer fill said apertures substantially coplanar with said device layer is performed after said step of forming a set of field apertures in areas of pad insulator disposed between isolation apertures separated by a minimum active area distance.

22. A method of forming a set of insulator plugs in an isolation trench in a semiconductor substrate having a device layer comprising the steps of:

depositing a pad insulator layer having a pad thickness;

implanting said pad insulator with ions such tat implanted areas of said pad insulator have an etch rate substantially greater than unimplanted areas of said pad insulator;

etching a set of isolation apertures through said device layer to an isolation depth;

depositing an insulator layer in said isolation apertures to a depth sufficient to fill said isolation apertures above said device layer by a first margin and having a sidewall thickness on isolation aperture walls;

etching said insulator layer such that said sidewall thickness of said insulator on said isolation aperture walls is removed and remaining insulator plugs of said insulator layer fill said isolation apertures above said device layer;

and etching said pad insulator layer with an etchant that does not attack said insulator layer, whereby said pad insulator is removed and said isolation plugs fill said aperture without CMP, in which said implanted areas are formed only in areas of pad nitride disposed between isolation apertures separated by greater than a minimum active area distance in which said step of etching said insulator layer such that said sidewall thickness of said insulator on said aperture walls is removed and remaining isolation plugs of said insulator layer fill said apertures substantially coplanar with said device layer is performed before said step of forming a set of apertures in areas of pad insulator disposed between isolation apertures separated by a minimum active area distance.

* * * * *